US010666403B2

(12) United States Patent
Sone

(10) Patent No.: US 10,666,403 B2
(45) Date of Patent: *May 26, 2020

(54) VARIABLE ISI TRANSMISSION CHANNEL APPARATUS

(71) Applicant: ARTEK KABUSHIKI KAISHA, Setagaya-ku, Tokyo (JP)

(72) Inventor: Kiyoshi Sone, Tokyo (JP)

(73) Assignee: Artek Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/264,252

(22) Filed: Jan. 31, 2019

(65) Prior Publication Data

US 2019/0165900 A1    May 30, 2019

Related U.S. Application Data

(63) Continuation-in-part of application No. 14/763,463, filed as application No. PCT/JP2014/052362 on Jan. 27, 2014, now Pat. No. 10,200,216.

(30) Foreign Application Priority Data

Jan. 28, 2013 (JP) ................................ 2013-027113

(51) Int. Cl.
*H04L 1/20* (2006.01)
*H01P 3/08* (2006.01)
(Continued)

(52) U.S. Cl.
CPC ........ *H04L 1/205* (2013.01); *G01R 31/31709* (2013.01); *H01P 3/08* (2013.01); *H01P 5/04* (2013.01)

(58) Field of Classification Search
CPC ...... H04L 1/205; G01R 31/31709; H01P 3/08
See application file for complete search history.

(56) References Cited

U.S. PATENT DOCUMENTS

2003/0041294 A1    2/2003  Moll et al.
2006/0253748 A1   11/2006  Brink et al.
(Continued)

FOREIGN PATENT DOCUMENTS

JP    H05-014004 A    1/1993
JP    H10-004305 A    1/1998
(Continued)

OTHER PUBLICATIONS

International Search Report dated Apr. 1, 2014 in PCT Application No. PCT/JP2014/052362, 4 pgs.

(Continued)

*Primary Examiner* — Samuel S Outten
(74) *Attorney, Agent, or Firm* — Knobbe, Martens, Olson & Bear, LLP

(57) ABSTRACT

A variable ISI transmission channel apparatus inserted in a high-speed transmission channel for the high-speed serial data communication simulates a "live" ISI environment to which the high-speed transmission channel in operation is exposed, in a situation such as a bit error test by means of continuously adjusting an amount of inter-symbol interference (ISI) in the high-speed transmission channel.

By allowing an undersurface of a transmission loss generating member (6) (16) (26) such as a dielectric, a magnetic body, and an electric conductor to face, and slide on, a top surface of a conductor strip (2) exposed on a top surface of a plate-shaped dielectric substrate (1), a facing area is continuously increased/decreased. A dielectric loss, a magnetic loss, or a resistance loss increased/decreased in the transmission loss generating member is reflected on a high-frequency signal on the conductor strip (2).

18 Claims, 9 Drawing Sheets

(51) Int. Cl.
*G01R 31/317* (2006.01)
*H01P 5/04* (2006.01)

(56) References Cited

U.S. PATENT DOCUMENTS

| | | |
|---|---|---|
| 2008/0228426 A1 | 9/2008 | Calvin et al. |
| 2009/0312972 A1 | 12/2009 | Muller et al. |
| 2015/0365260 A1 | 12/2015 | Sone |

FOREIGN PATENT DOCUMENTS

| | | |
|---|---|---|
| JP | 2003-125010 A | 4/2003 |
| JP | 2006-317438 A | 11/2006 |
| JP | 2008-091258 A | 4/2008 |
| JP | 2009-302689 A | 12/2009 |
| WO | WO 2005/053084 A1 | 6/2005 |
| WO | WO 2008/072402 A1 | 6/2008 |

OTHER PUBLICATIONS

International Preliminary Report on Patentability dated Aug. 6, 2015 in corresponding PCT Application No. PCT/JP2014/052362, 5 pgs.

VARIABLE ISI TRANSMISSION CHANNEL APPARATUS

RELATED APPLICATIONS

This disclosure is a continuation-in-part of U.S. application Ser. No. 14/763,463, which was filed on Jul. 24, 2015 and is titled "VARIABLE ISI TRANSMISSION CHANNEL APPARATUS," and which is a 371 of International Application PCT/JP2014/052362 filed on Jan. 27, 2014, the disclosures of which are hereby incorporated by reference herein in its entirety. Further, this application claims priority to JP Application No. 2013-027113 filed on Jan. 28, 2013, the disclosure of which is hereby incorporated by reference herein in its entirety. Any and all applications, if any, for which a foreign or domestic priority claim is identified in the Application Data Sheet of the present application are hereby incorporated by reference in their entireties under 37 CFR 1.57.

TECHNICAL FIELD

The present invention relates to an apparatus converting a continuous pulse train into a pulse train having a desired pattern in the electronic communication field and typically to a variable ISI transmission channel apparatus interposed in a transmission channel transmitting high-speed serial data of about 5 Gb/s at a reference clock of about 100 MHz for generating a data dependent jitter (DDJ) derived from inter-symbol interference (ISI).

BACKGROUND ART

With regard to a jitter (a temporal irregularity of characteristic instants regulating a unit interval that is a period of a bit state) dominating a bit error rate (BER) representative of the communication quality in a communication system transmitting high-speed serial data, a total jitter at each BER includes a random jitter (RJ) characterized by unbounded stochastic variations and a deterministic jitter (DJ) characterized by a bounded time width P-P value, and the former, i.e., RJ, includes a thermal noise, shot noise, and flicker, while the latter, i.e., DJ, includes a periodical jitter (PD) such as a sinusoidal jitter (SJ), a data-dependent jitter (DDJ) affected by a pulse sequence representative of data contents, and a bounded uncorrelated jitter (BUJ) such as crosstalk.

The data-dependent jitter (DDJ) related to the present invention is known to be caused by a synergetic effect between duty cycle distortion (DCD) causing an irregularity of a reference clock and inter symbol interference (ISI) derived solely from an attribute of a high-speed transmission channel (e.g., "Reduction of BER of serial data by the clock jitter analysis" Agilent Technologies Co., Ltd. ed., February 2007, also published in the web site).

Among the causes of the total jitter at the BER, conventionally, the inter symbol interference (ISI) is an external factor serving as a given condition that is an attribute of a transmission channel from the viewpoint of apparatus design and, therefore, the verification of actual contribution to EBR is of serious concern for ensuring the communication quality.

To comprehend the bit error rate (BER), various bit error rate testers (BERTs) are frequently used and the description of U.S. Pat. No. 7,979,225 discloses a configuration that sends out high-speed serial data pursuant to various test patterns from a pattern generator incorporated in the bit error rate tester (BERT) to an ISI board simulating a high-speed transmission channel, that supplies the serial data taking on a desired amount of DDJ derived from ISI in the ISI board to a devise under test (DUT), and that returns the output of the devise under test (DUT) to a pattern analyzer incorporated in the bit error rate tester (BERT) so as to enable the comprehension of a limit of proper/improper operation by the devise under test (DUT) for the various test patterns in a short period of time.

The description of U.S. Pat. No. 7,272,756 discloses a technique of creating a test bit pattern on the premise of "Common Electrical I/O(CEI)-Electrical and Jitter Interoperability Agreements For 6G+bps and 11G+bps I/O-1A # OIF-CEI-01.0 (Optical Internetworking Forum 2004)" and "ITU-TO.150 section 5.8" used as international standards related to a test pattern for a BER test.

The ISI board simulating a high-speed transmission channel for the high-speed serial data communication as mentioned in the description of U.S. Pat. No. 7,979,225 is marketed under the product name "Differential Isi Board" by Synthesys Research Inc., California, US.

A general configuration of this kind of ISI board is introduced as a conventional technique in the description of U.S. Pat. No. 8,224,613 with reference to FIG. 1.

In general, in the configuration of this kind of ISI board, as depicted in FIG. 9 accompanying the description of this application, a conductor strip (91a) is embedded inside a plate-shaped dielectric substrate (91) with a dielectric of the substrate itself interposed between the conductor strip and a conductor foil (not depicted) covering the entire undersurface of the substrate and extends to draw a line pattern having a constant width in a plane view while another conductor strip (92a) having a length different from the conductor strip (91a) extends to draw a line pattern having a constant width in a plane view, and a further conductor strip (93a) extends to draw a long linear pattern having a constant width with a curved portion corresponding to a bottom portion of a U-shape in a plane view.

In this way, a plurality of types of the conductor strips (91a) (92a) (93a) embedded inside the plate-shaped dielectric substrate (91) is prepared, drawing patterns having a constant width and respective different lengths and shapes.

Both end portions of each of the conductor strips (91a) (92a) (93a) are coupled to, for example, the sub-miniature A connectors and, in FIG. 9, connectors (91c) (91d) (92c) of this type are depicted.

Although each of the conductor strips (91a) (92a) (93a) exhibits the similar function as a coaxial cable and all the strips form a constant characteristic impedance, each of the conductor strips different in length applies a different transmission loss to a high-frequency transmission signal of high-speed serial data on each of the selectively used conductor strips and, therefore, different amounts of ISI are implemented in multiple stages.

Therefore, in the usual manner, an ISI board of this kind is interposed between a pattern generator and a pattern analyzer built in a bit error rate tester (BERT) to introduce a high-frequency output signal of the pattern generator via a coaxial cable to, for example, the connector (91c) selected as a signal input terminal of the ISI board and to derive the high-frequency output signal via another coaxial cable from the connector (91d) at the other end of the conductor strip (91a) corresponding to the connector (91c) on the ISI board, so as to apply a transmission loss set fixedly in advance for a selected conductor strip to the high-frequency signal for high-speed serial data communication on the selected conductor strip (91a), thereby selectively actualizing an amount of ISI set fixedly in advance in multiple stages.

In the case of "Differential Isi Board" of Synthesys Research Inc. described above, nine stages of ISI amounts can be set by using nine types of conductor strip patterns.

In many cases, to handle a pair of differential signals, an ISI board has the conductor strip (91a) etc. each formed as a pair of strips extended in parallel and in close proximity to each other so as to make up a differential transmission channel and the connectors (91c) (91d) etc. in the both end portions of the conductor strips are each disposed as a set of two connectors in each end portion; however, in the description of this application, for the purpose of simplicity and clarification, an ISI board for single ended form transmission are exemplarily illustrated, including the configuration of the conventional example of FIG. 9.

Although discrete ISI amounts for respective preset stages can be set each time a bit error rate (BER) test condition is set, the ISI amount cannot continuously and variably be set in a wide range while immediately reflecting a result of the bit error rate (BER) tests and, therefore, the conventional ISI board has a problem that it is difficult to simulate ISI to which digital data communication is exposed in an actual transmission channel, in other words, "live" ISI.

Nonpatent Literature 1: "Reduction of BER of serial data by the clock jitter analysis" Agilent Technologies Co., Ltd. ed., February 2007 (also published in the web site), pp. 6-9

Patent Document 1: U.S. Pat. No. 7,979,225
Patent Document 2: U.S. Pat. No. 7,272,756
Patent Document 3: U.S. Pat. No. 8,224,613

SUMMARY OF THE INVENTION

Problem to be Solved by the Invention

In view of a problem of a conventional ISI board that it is difficult to completely implement a simulation of an actual transmission channel because of an inability to continuously and variably set an ISI amount, it is an object of the present invention to provide a variable ISI transmission channel apparatus solving the above problem, enabling continuous variable setting of an ISI amount, and capable of simulating so-called "live" ISI.

Means for Solving Problem

To solve the problem, an aspect of the inventions of claims 1 to 17 provides a variable ISI transmission channel apparatus solving the problem and enabling through an appropriate operation the continuous variable setting of an ISI amount for the high-speed serial data communication by achieving a configuration such that, with regard to a facing area when a transmission loss generating means (B) made up of a transmission loss generating member (6) (16) (26) (36) faces a conductor strip (2) exposed on a top surface of a dielectric substrate (1) in a conductor-strip-exposed transmission channel means (A) including, for instance, a microstrip line and a coplanar line, a transmission loss generating member driving means (C) drives and slides the transmission loss generating means (B) so as to continuously increase and decrease the facing area.

With regard to the configurations of an aspect of the inventions of claims 2, 5, and 8, a dielectric (6), a magnetic body (16), and an electric conductor (26) are selected, respectively, as the transmission loss generating member of the transmission loss generating means (B) facing the conductor strip (2) in a configuration of an aspect of the invention of claim 1.

When the dielectric (6) faces the conductor strip (2), a dielectric loss is generated in the dielectric (6) under the effect of a high-frequency electric field produced by a high-frequency signal for the high-speed serial data communication on the conductor strip (2) and, since the high-frequency signal is an electric energy source for the loss, an amount of the loss is reflected as a transmission loss of the high-frequency signal.

When the magnetic body (16) faces the conductor strip (2), a magnetic loss is generated in the magnetic body (16) under the effect of a high-frequency magnetic field produced by a high-frequency signal for the high-speed serial data communication and, since the high-frequency signal is also an electric energy source for the loss, an amount of the loss is reflected as a transmission loss of the high-frequency signal.

When the electric conductor (26) faces the conductor strip (2), a resistance loss is generated due to the induction of an eddy current in the electric conductor (26) under the effect of a high-frequency magnetic field produced by a high-frequency signal for the high-speed serial data communication and, since the high-frequency eddy current is also an electric energy source for the loss, an amount of the loss is reflected as a transmission loss of the high-frequency signal.

The transmission loss reflected on the high-frequency signal on the conductor strip (2) in this way has frequency characteristics specific to the quality of the material of the transmission loss generating member and this leads to the formation of a main cause of the generation of ISI.

A change in an amount of the transmission loss is dominated by the facing area of the transmission loss generating member to the conductor strip (2) and therefore can continuously be adjusted in a wide range by driving and sliding the transmission loss generating member through a desired operation to continuously increase and decrease the facing area.

As a result, an amount of ISI can continuously and variably be set in a wide range.

With regard to the configurations of an aspect of the inventions of claims 11 and 12, as the transmission loss generating member of the transmission loss generating means (B) in the configuration of the aspect of the invention of claim 1, a sliding combined body of a dielectric half piece (36a) and an electric conductor half piece (36b) making a pair is selected in the aspect of the invention of claim 11, and a sliding combined body of a magnetic body half piece (16a) and the electric conductor half piece (36b) making a pair is selected in the aspect of the invention of claim 12.

The dielectric half piece (36a), the magnetic body half piece (16a), and the electric conductor half piece (36b) generate a dielectric loss, a magnetic loss, and a resistance loss, respectively, in the same way when facing the conductor strip (2), and an amount of combination of respective losses in each of the sliding combined bodies (36) (16a/36b) is reflected as a transmission loss of the high-frequency signal on the conductor strip (2).

With regard to a configuration of an aspect of the inventions of claims 3, 6 and 9, a pattern of the conductor strip (2) on the dielectric substrate (1) in the configurations of an aspect of the inventions of claims 2, 5 and 8 extends to draw a U-shape in a plane view.

As for the conductor strip (2) extending to draw a U-shape in a plane view, since the conductor strip having a narrow width extends in a sliding direction within a long sliding range of the transmission loss generating members (6) (16) (26), an increase and decrease in the facing area are small relative to an increase and decrease in the sliding movement of the transmission loss generating member, and therefore, this results in being preferable to the stable adjustment of an ISI.

With regard to a configuration of an aspect of the inventions of claims 4, 7 and 10, a pattern of the conductor strip (2) on the dielectric substrate (1) in the configuration of an aspect of the inventions of claims 2, 5 and 8 extends to draw a pattern of waves in a plane view.

On another front, as for the conductor strip (2) extending to draw a pattern of waves in a plane view within a longitudinal area having a multiplicity of oblique portions (2aa) (2bb), since the longitudinal direction of the longitudinal area is arranged so as to intersect on a plane surface with the direction of a sliding movement of the transmission loss generating members (6) (16) (26), a relatively short sliding range of the sliding movement of the same members (6) (16) (26) could afford a significant increase and decrease in the facing area, and therefore, this results in being preferable to the highly sensitive (intensively effective) adjustment of an ISI.

With regard to the configurations of an aspect of the inventions of claims 13 and 14, each of the sliding combined bodies (36) (16a/36b) in the configurations of an aspect of the inventions of claims 11 and 12, respectively, faces the conductor slip (2) extending to draw a U-shape in a plane view on the dielectric substrate (1).

With regard to the configurations of an aspect of the inventions of claims 15 and 16, each of the sliding combined bodies (36) (16a/36b) in the configurations of an aspect of the inventions of claims 11 and 12, respectively, face the conductor strip (2) extending to draw a pattern of waves in a plane view on the dielectric substrate (1).

With regard to a configuration of an aspect of the invention of claim 17, a sliding support sheet (5) is interposed between the conductor strip (2) and the transmission loss generating members (6) (16) (26) (36) to face an undersurface of said members with a top surface of the conductor strip (2) indirectly.

With regard to a configuration of an aspect of the invention of claim 18, a method of variably setting an amount of inter-symbol interference (ISI) is covered on the basis of the special technical features of the invention of claim 1.

Effect of the Invention

According to the aspect of the inventions of claims 1 to 18, since the facing area of the transmission loss generating members (6) (16) (26) (36) facing the conductor strip (2) exposed on the top surface of the dielectric substrate (1) is continuously increased and decreased by means of driving and sliding said transmission loss generating members relative to the conductor strip, an amount of ISI to the high-frequency signal for the high-speed serial data communication on the conductor strip (2) can continuously be adjusted and, therefore, the excellent effect is provided that enables a more practical simulation of an ISI environment in a so-called "live" high-speed serial data (code) communication line actually operated for the high-speed data communication.

EXPLANATIONS OF LETTERS OR NUMERALS

Figure 1:
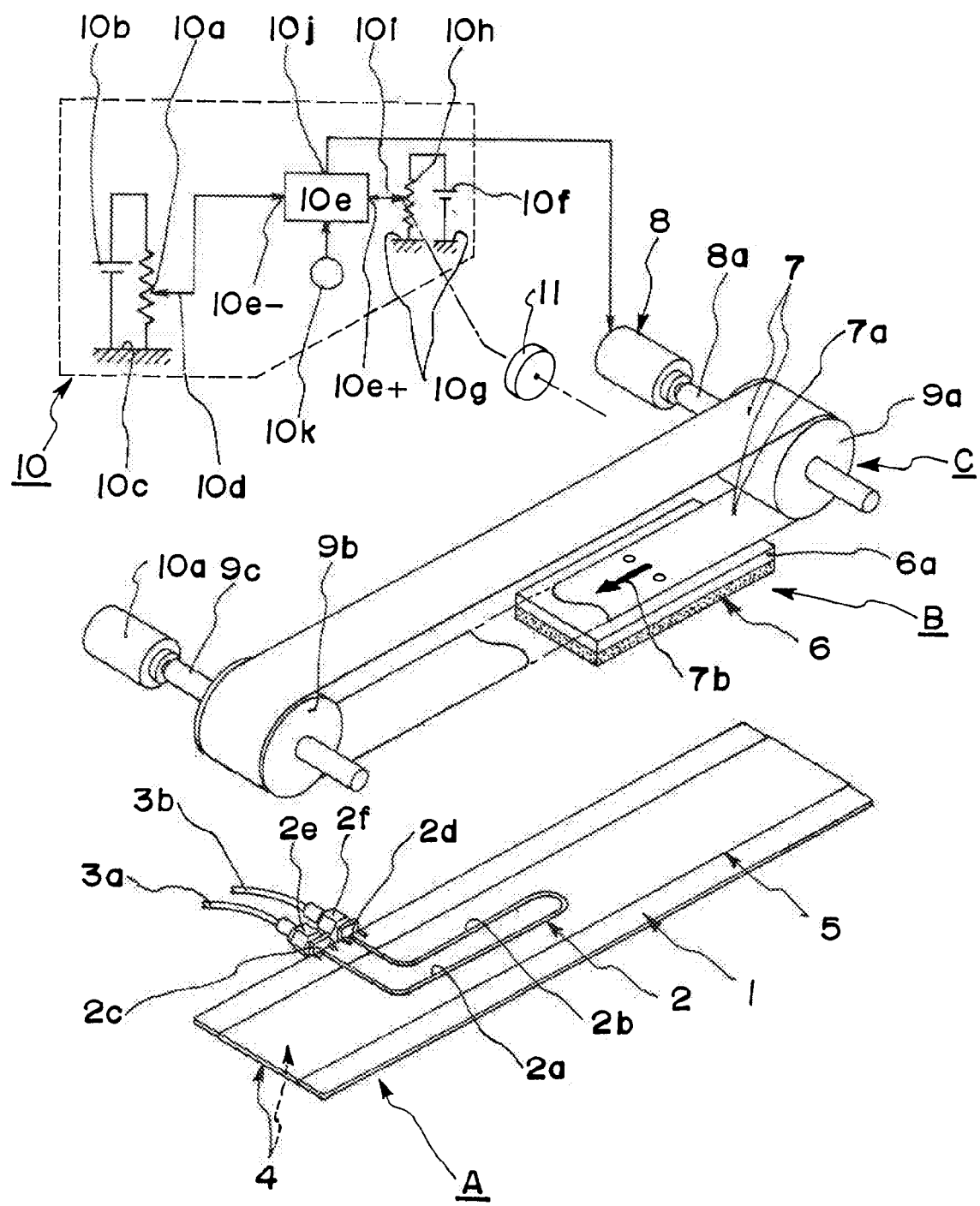
FIG. 1 is a perspective explanatory view of a configuration example of an embodiment of a variable ISI transmission channel apparatus of an aspect of the inventions of claims 1, 2, 3 and 17.

A conductor-strip-exposed transmission channel means
B transmission loss generating means
C transmission loss generating member driving means
1 plate-shaped dielectric substrate
2 conductor strip
2a, 2b parallel line portion
2aa first oblique portion
2bb second oblique portion
2c, 2d a pair of end portions of conductor strip 2
2e, 2f sub-miniature A connector
3a input-signal coaxial cable
3b output-signal coaxial cable
4 conductive ground member
5 sliding support sheet
6 dielectric
6a attachment support plate
7 drive belt
7a lower half portion of drive belt 7
8 drive motor
8a rotation drive shaft
9a drive drum
9b passive drum
9c rotation shaft
10 drive control circuit
10a, 10h rotating potentiometer
10b, 10f, 10k direct-current power source
10e comparative adjuster
11 adjustment dial
16 magnetic body
16a magnetic body half piece
16b magnetic body half piece
26 electric conductor
36 sliding combined body
36a dielectric half piece 36b electric conductor half piece
36c boundary line

MODES FOR CARRYING OUT THE INVENTION

FIG. 1 is a perspective explanatory view of one configuration of a best embodiment of the present invention.

On a top surface of a plate-shaped dielectric substrate (1) as a typical figuration of the dielectric substrate which is made of a dielectric having a relatively low dielectric constant such as a Teflon resin and a polyimide resin and forming a rectangle in a plane view, a conductor strip (2) such as a pattern-formed copper foil layer is exposed upward and extended on the top surface of the substrate (1) by a normal printed wiring manufacturing technique.

The conductor strip (2) extends to draw a pattern of a U-shape in a plane view having a pair of parallel line portions (2a) (2b) extending in a longitudinal direction of the rectangle in a plane view.

A pair of end portions (2c) (2d) of the U-shaped conductor strip (2) is connected to respective signal terminals of a pair of regular sub-miniature A connectors (2e) (2f) disposed on a peripheral part of the plate-shaped dielectric substrate (1).

The respective signal terminals of the connectors (2e) (2f) are connected to an input-signal coaxial cable (3a) and an output-signal coaxial cable (3b). The respective ground terminals of the connectors (2e) (2f) are connected to a conductive ground member (4) made of a sheet conductor foil disposed on the entire bottom surface in a plane view of the substrate (1) located under the conductor strip (2) with the dielectric of the plate-shaped dielectric substrate (1) interposed therebetween.

The conductive ground member (4) may be a U-shaped pattern conductive foil formed on the bottom surface of the plate-shaped dielectric substrate (1), which pattern is corresponding to that of the conductor strip (2).

The conductive ground member (4) of the sheet conductive foil or the U-shaped pattern conductive foil may be located such that the conductive ground member (4) is sandwiched or slotted in the dielectric on the lower side when viewed from the top surface of the plate-shaped dielectric substrate (1).

The plate-shaped dielectric substrate (1), the conductor strip (2) exposed on the upside of the substrate (1), and the conductive ground member (4) make up a conductor-strip-exposed transmission channel means (A) acting as a microstrip line. For the conductor-strip-exposed transmission channel means (A) acting as a high-speed transmission channel for the high-speed serial data communication, a coplanar line is frequently used in addition to the microstrip line.

For reference, the coplanar line is configured to have a conductive ground member in the form of a pair of wide strips made from conductor foils exposed and extended on top surfaces of peripheral bank portions on the both sides of a top surface of a plate-like dielectric substrate, a pair of dielectric slots exposed and arranged on the top surface of the plate-like dielectric substrate along an inner edge of each of the pair of wide conductor strips, and another conductor strip exposed and disposed on a top surface of a center bank portion on the top surface of the dielectric substrate, which conductor strip extends between the pair of dielectric slots in parallel with the slots at the same height position as the pair of wide conductor strips.

Both the microstrip line and the coplanar line have a function of a coaxial cable and have a common feature of conductor-strip-exposed transmission channels in that a conductor strip transmitting a high-frequency signal is exposed on a top surface of the dielectric substrate.

Accordingly, an inner conductor of a coaxial cable is also included in the microstrip line i.e. the conductor strip (2) of the conductor-strip-exposed transmission channel means (A).

In case of the inner conductor of the coaxial cable, however, the inner conductor as the conductor strip (2) turns out to be located on a dielectric of the air surrounding a lower half-plane of the inner conductor.

An extremely-thin sliding support sheet (5) of about 0.05 mm thick is made up of a low-friction-coefficient member made of an insulating material having a relatively low dielectric constant such as a Teflon sheet and is affixed and extended on the top surface of the plate-shaped dielectric substrate (1) so as to cover the longitudinal area where the conductor strip (2) extends to draw the U-shaved parallel portions (2a) (2b) in a plane view.

A dielectric (6) formed into a rectangular parallelepiped having a rectangular shape in a plane view has a width matching a width orthogonal to the longitudinal direction of the sliding support sheet (5) and is disposed as a transmission loss generating member above the top surface of the plate-shaped dielectric substrate (1), facing the top surface of the substrate (1) in a range covering the u-shaped conductor strip (2).

The dielectric (6) is made of a dielectric having a relatively high dielectric constant and expected to generate a large dielectric loss such as an epoxy resin and a glass epoxy resin or of a ferroelectric having a higher dielectric constant and expected to generate a larger dielectric loss such as barium titanate, is fixed to a lower half portion (7a) of a drive belt (7) on the upper side via an easily-machined non-metal attachment support plate affixed onto a top surface, and is movable along the sliding support sheet (5) in accordance with running of the belt.

The dielectric (6) acting as the transmission loss generating member in this case makes up a transmission loss generating means (B).

The drive belt (7) is bridged between a drive drum (9a) coupled to a rotation drive shaft (8a) of a drive motor (8) made up of a direct-current magnet motor having a built-in reduction gear and a passive drum (9b).

The horizontal height positions of the both drums (9a) (9b) and, thus, the horizontal height position of the drive belt (7) is selected to the height position at which the undersurface of the dielectric (6) acting as the transmission loss generating member fixed to the undersurface of the belt is brought into slidable contact with the top surface of the sliding support sheet (5).

An interval between the both drums (9a) (9b) is selected such that the dielectric (6) can slide on the sliding support sheet (5) within a range of the sheet 5 in the longitudinal direction.

The drive motor (8) is connected to a drive control circuit (10). The drive belt (7), the drive motor (8), the drive drum (9a), and the passive drum (9b) in this case may make up a transmission loss generating member driving means (C).

In the drive control circuit (10), a rotating potentiometer (10a) coupled to a rotation shaft (9c) of the passive drum (9b) is inserted and connected between a direct-current power source (10b) and a ground (10c).

A turning slider terminal (10d) of the rotating potentiometer (10a) driven and turned by the rotation shaft (9c) is connected to an inverting input terminal (10e−) of a controlling comparator (10e).

A non-inverting input terminal (10e+) of the controlling comparator (10e) is connected to a turning slider terminal (10i) of a rotating potentiometer (10h) for setting a target position, inserted and connected between a direct-current power source (10f) and a ground (10g).

The turning slider terminal (10i) is mechanically coupled to an adjustment dial for setting a target position of a transmission loss generating member disposed on an apparatus panel not depicted, i.e., for variably setting an ISI amount.

An output terminal (10j) of the controlling comparator (10e) is connected to the drive motor (8).

A direct-current power source (10k) for a drive motor is connected to the controlling comparator (10e), and the power source (10k) is connected via the controlling comparator (10e) to the drive motor (8).

When the drive drum (9a) is rotationally driven clockwise on the plane of FIG. 1 by the rotation of the rotation drive shaft (8a) of the drive motor (8) in the configuration of the exemplary embodiment depicted in FIG. 1, the lower half portion (7a) of the drive belt (7) and the dielectric (6) acting as the transmission loss generating member are integrally moved in a leftward direction on the plane of FIG. 1, i.e., in a direction of an arrow (7b).

The undersurface of the dielectric (6) contacting the top surface of the sliding support sheet (5) on the top surface of the plate-shaped dielectric substrate (1) is supported by the sheet (5), and the dielectric (6) slides on the sheet (5) in the direction of the arrow (7b).

As the sliding of the dielectric (6) advances, the undersurface of the dielectric (6) comes to the U-shaped conductor strip (2) exposed upward immediately beneath the sliding support sheet (5) and gradually increases a facing area against the strip (2) to cover the strip (2).

On the contrary, when the drive drum (9a) is rotationally driven anticlockwise on the plane of FIG. 1 by the inverse rotation of the rotation drive shaft (8a) of the drive motor (8), the dielectric (6) moves in the direction opposite to the arrow (7b), thereby gradually reducing the facing area of the undersurface of the dielectric (6) with the conductor strip (2).

A broadband high-frequency signal for the high-speed serial data communication introduced from the input-signal coaxial cable (3a) is transmitted via the signal terminal of the connector (2e) to one parallel line portion (2a) of the pattern drawing a U-shape of the conductor strip (2) exposed on the top surface of the plate-shaped dielectric substrate (1) and is led out through the other parallel line portion (2b) via the signal terminal of the connector (2f) to the output-signal coaxial cable (3b).

Both the parallel line portions (2a) (2b) extend over a longitudinal area of continued feature of a pattern drawing a U-shape in a plain view having a pair of parallel portions (2a) (2b). A longitudinal direction of the longitudinal area is set on a plane surface along a sliding direction shown by the arrow (7b) in FIG. 1 of the transmission loss generating members (6) (16) (26).

By the high-frequency signal transmitted through a pair of the exposed parallel line portions (2a) (2b), high-frequency electric and magnetic fields are produced above the top surface of the conductor strip (2) including the parallel line portions (2a) (2b).

When the undersurface of the dielectric (6) acting as the transmission loss generating member slides in the direction of the arrow (7b) in FIG. 1 on the sliding support sheet (5) to form a facing area with the conductor strip (2), the dielectric (6) is mainly exposed to the high-frequency electric field produced by the parallel line portions (2a) (2b) of the conductor strip (2).

In this case, a dielectric loss due to the polarization of the dielectric (6) generated in the dielectric (6) mainly uses the high-frequency signal on the parallel line portions (2a) (2b) as an electric energy source and, therefore, an amount of the dielectric loss is reflected as a transmission loss of the high-frequency signal on the conductor strip (2).

For the dielectric (6) acting as the transmission loss generating member, a dielectric or ferroelectric material having a high dielectric constant can be selected to allow a sufficient amount of transmission loss to be reflected on the high-frequency signal on the conductor strip (2).

In this case, although the sliding support sheet (5) such as a Teflon sheet ensures favorable sliding of the dielectric (6) on the sheet (5) because of the effect of the low friction coefficient, little transmission loss is reflected on the high-frequency signal on the conductor strip (2) because of the low dielectric constant.

It is noted that the interposition of the sliding support sheet (5) may optionally be eliminated to achieve a configuration in which the undersurface of the transmission loss generating member directly contacts the top surface of the conductor strip (2), by means of ensuring a low friction coefficient between the transmission loss generating member and the top surface of the conductor strip (2) through the selection of the dielectric (6) itself acting as the transmission loss generating member etc. or through a working processing such as sinter forming after blending a solid lubricant, and surface polishing of the dielectric.

In the descriptions of this specification and claims, "facing" represents that the undersurface of the transmission loss generating member such as the dielectric (6) and the top surface of the conductor strip (2) are in the vicinity of, or in contact with, each other regardless of whether the sliding support sheet (5) is interposed.

As the sliding of the dielectric (6) advances in the direction of the arrow (7b) in FIG. 1 on the sliding support sheet (5), the facing area of the dielectric (6) with the conductor strip (2) increases and, therefore, the transmission loss reflected on the high-frequency signal on the conductor strip (2) accordingly increases.

On the contrary, as the sliding of the dielectric (6) advances in the direction opposite to the direction of the arrow (7b) in FIG. 1, the facing area of the dielectric (6) with the conductor strip (2) decreases and, therefore, the transmission loss reflected on the high-frequency signal on the conductor strip (2) accordingly decreases.

By adjusting the position on the plate-shaped dielectric substrate (1) and, thus, the position along the conductor strip (2), of the dielectric (6) acting as the transmission loss generating member facing the exposed top surface of the conductor strip (2), an amount of the transmission loss reflected on the high-frequency signal on the conductor strip (2) can be changed.

As for adjusting the position of the dielectric (6) on the plate-shaped dielectric substrate (1) mentioned here means changing the facing area of the dielectric (6) with the conductor strip (2).

Accordingly, the position of the transmission loss generating means (B) made up of the dielectric (6) as a transmission loss generating member could be even adjusted at pleasure by means of sliding or driving the transmission loss generation means (B) in a direction intersecting on a plane surface with a longitudinal direction of the longitudinal area where the conductor strip (2) extends to draw U-shaped parallel portions (2a) (2b).

The transmission loss reflected on the high-frequency signal on the conductor strip (2) due to the dielectric loss generated in the dielectric (6) acting as the transmission loss generating member exhibits a different amount for each frequency component of the high-frequency signal depending on the quality of material of the dielectric (6) and, therefore, the transmission loss has frequency characteristics specific to the quality of material of the selected dielectric.

The specific frequency characteristics are an important factor for influencing the generation of an ISI (inter symbol interference) and a degree thereof.

By utilizing this factor, a variable ISI transmission channel apparatus is achieved that can quantitatively variably set the generation of the irregularity of characteristic instants (ISI jitters) depending on a code sequence in the high-speed serial data (code) communication, the code sequence being transmitted through the conductor-strip-exposed transmission channel means (A) employed in this case, as a passive generation source of an ISI.

This apparatus can more practically simulates an ISI environment in a conductor-strip-exposed transmission channel etc. acting as a so-called "live" high-speed serial data (code) communication line actually operated.

To quantitatively variably set the generation of the ISI jitters, an operator turns an adjustment dial (11) disposed on the apparatus panel not depicted by a desired angle.

This causes a turning slider of the rotating potentiometer (10h) for setting a target position to turn and slide, and a target setting voltage appears through the variable resistance division of a voltage of the direct-current power source (10f) for a target setting voltage and is supplied from the turning slider terminal (10i) to the non-inverting input terminal (10e+) of the controlling comparator (10e).

The direct-current power source (10k) for a drive motor supplies the electricity on and off via intermittent control by the controlling comparator (10e) to the drive motor (8) to rotate the same motor (8).

By the rotation of the drive motor (8), the drive drum (9a) and the passive drum (9b) are synchronously rotated via the drive belt (7) as described above.

This causes a turning slider of the rotating potentiometer (10a) to turn in tandem with the rotation of the passive drum (9b), and a control voltage appears through the variable resistance division of a voltage of the direct-current power source (10b) for the control voltage and is supplied from the turning slider terminal (10d) to the inverting input terminal (10e−) of the controlling comparator (10e).

As a result, when incremental and decremental variations occur in the control voltage appearing at the turning slider terminal (10d) of the rotating potentiometer (10a) depending on the passive rotation of the passive drum (9b), the controlling comparator (10e) operates to achieve commonly-known and commonly-used constant value control so that if the control voltage increases relative to the target setting voltage, the drive motor (8) is supplied with the direct-current power source (10k) for a drive motor in a polarity to drive rotationally the both drums (9a) (9b) in the rotation direction ensuring a decrease in the control voltage and, conversely, so that if the control voltage decreases relative to the target setting voltage, the drive motor (8) is supplied with the direct-current power source (10k) for a drive motor with the polarity switched to drive rotationally the both drums (9a) (9b) in the rotation direction ensuring an increase in the control voltage.

As a result, when the operation of the adjustment dial (11) causes the dielectric (6) to move to the position of the passive drum (9b) and, thus, the position of the dielectric (6) acting as the transmission loss generating member on the conductor strip (2), at which the control voltage matching the set target setting voltage is supplied, the electricity supplied from the controlling comparator (10e) to the drive motor (8) disappears and the constant value control is balanced and stopped.

Instead of the constant value control by the drive control circuit (10), any known means may arbitrarily be employed that may mechanically slide the dielectric (6) itself acting as the transmission loss generating member along the sliding support sheet (5) and, for example, the drive drum (9a) itself may be rotated by manual operation.

Such a configuration is included in the transmission loss generating member driving means (C).

Figure 2:
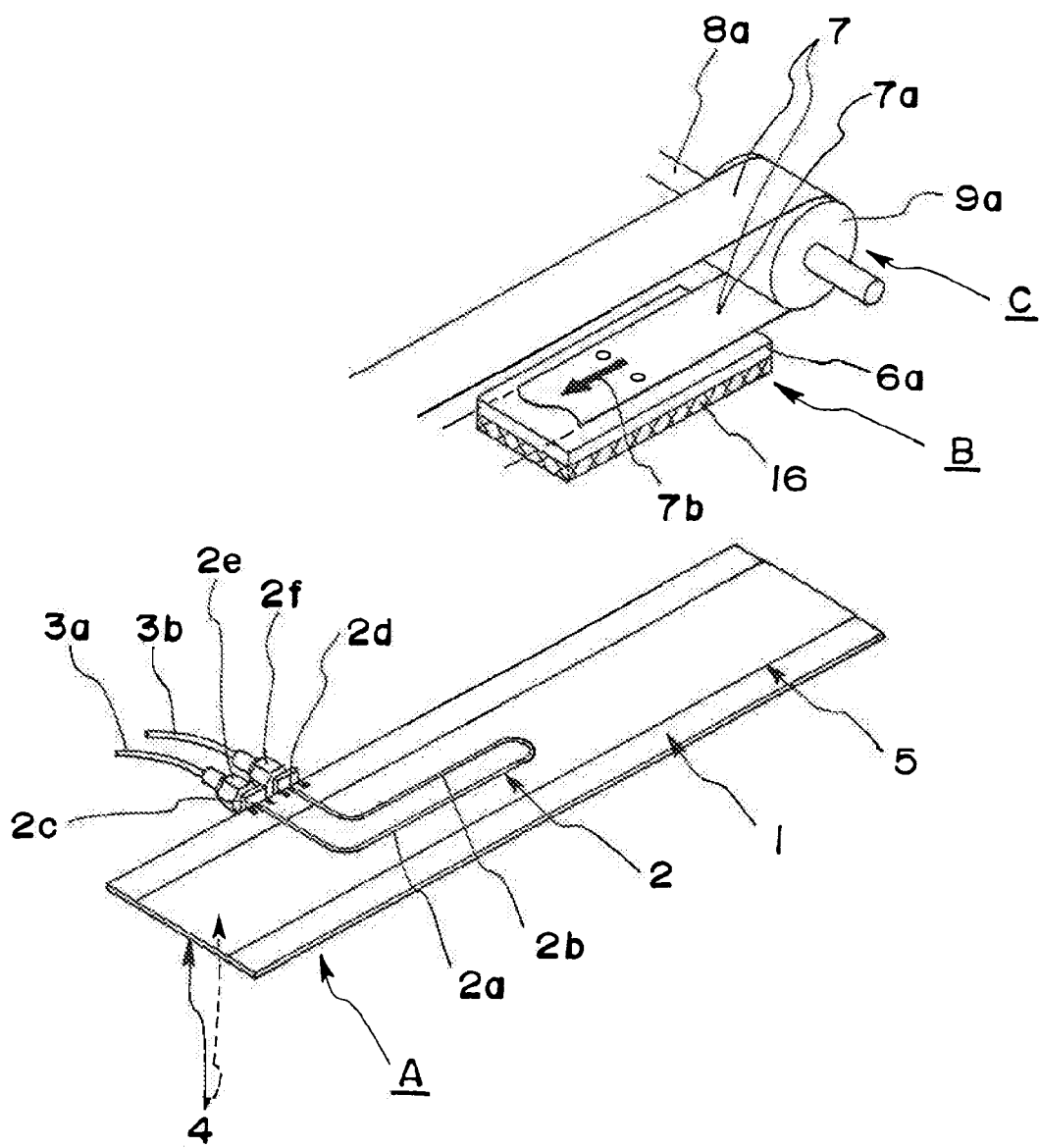
FIG. 2 is a perspective explanatory view of a main portion extracted from a configuration example of an embodiment of a variable ISI transmission channel apparatus of an aspect of the inventions of claims 5 and 6.

FIG. 2 depicts a configuration of another embodiment related to the transmission loss generating member and the constituent elements denoted by the same reference numerals in FIG. 1 denote the same respective elements.

The transmission loss generating means (B) is made up of a magnetic body (16) instead of the dielectric (6) acting as the transmission loss generating member.

The configuration and operations of the portions other than the transmission loss generating means (B) are the same as the embodiment of FIG. 1.

The magnetic body (16) for the transmission loss generating member is a ferromagnetic body (ferrimagnetic body) having a high magnetic permeability (on an initial magnetization curve) such as ferrite and magnetite and is preferably the magnetic body (16) with a large magnetic loss such as a hysteresis loss.

When the undersurface of the magnetic body (16) acting as the transmission loss generating member faces the conductor strip (2) to form a facing area with the conductor strip (2), the magnetic body (16) is mainly exposed to a high-frequency magnetic field produced by the parallel line portions (2a) (2b) of the conductor strip (2).

In this case, a magnetic loss generated in the magnetic body (16) due to a hysteresis curve of the magnetic body (16) mainly uses the high-frequency signal on the parallel line portions (2a) (2b) as a magnetic energy source and, therefore, an amount of the magnetic loss is reflected as a transmission loss of the high-frequency signal on the conductor strip (2).

For the magnetic body (16) acting as the transmission loss generating member, a ferromagnetic material having a high magnetic permeability (on an initial magnetization curve) can be selected to reflect a sufficient amount of transmission loss upon the high-frequency signal on the conductor strip (2).

Figure 3:
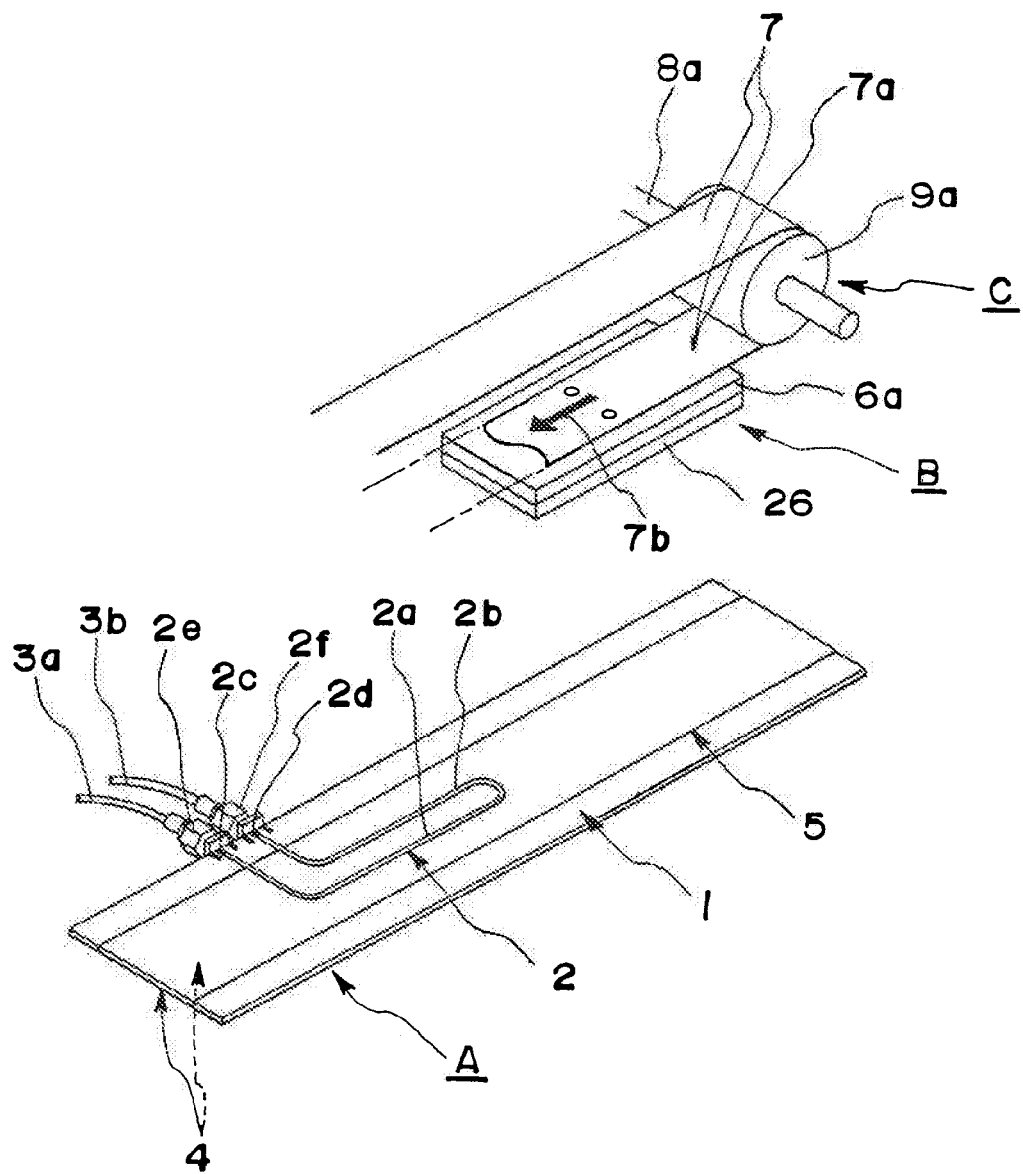
FIG. 3 is a perspective explanatory view of a main portion extracted from a configuration example of an embodiment of a variable ISI transmission channel apparatus of an aspect of the inventions of claims 8 and 9.

FIG. 3 depicts a configuration of another embodiment related to the transmission loss generating member and the constituent elements denoted by the same reference numerals in FIG. 1 denote the same respective elements.

The transmission loss generating means (B) is made up of an electric conductor (26) such as a metal instead of the dielectric (6) acting as the transmission loss generating member.

The configuration and operations of the portions other than the transmission loss generating means (B) are the same as the embodiment of FIG. 1.

The electric conductor (26) for the transmission loss generating member is preferably of a metal generating a sufficient resistance loss from electric resistance, such as copper, iron, aluminum, and stainless steel.

When the undersurface of the electric conductor (26) acting as the transmission loss generating member faces the conductor strip (2) to form a facing area with the conductor strip (2), the electric conductor (26) is mainly exposed to a high-frequency magnetic field produced by the parallel line portions (2a) (2b) of the conductor strip (2).

In this case, a resistance loss is generated in the electric conductor (26) due to an eddy current induced in the electric conductor (26) by an interlinkage magnetic flux between the high-frequency magnetic field and the electric conductor (26) and mainly uses the high-frequency signal on the parallel line portions (2a) (2b) as a magnetic energy source and, therefore, an amount of the resistance loss is reflected as a transmission loss of the high-frequency signal on the conductor strip (2).

For the electric conductor (26) acting as the transmission loss generating member, an electric conductor material having a proper electric resistance can be selected to reflect a sufficient amount of transmission loss on the high-frequency signal on the conductor strip (2).

Figure 4:
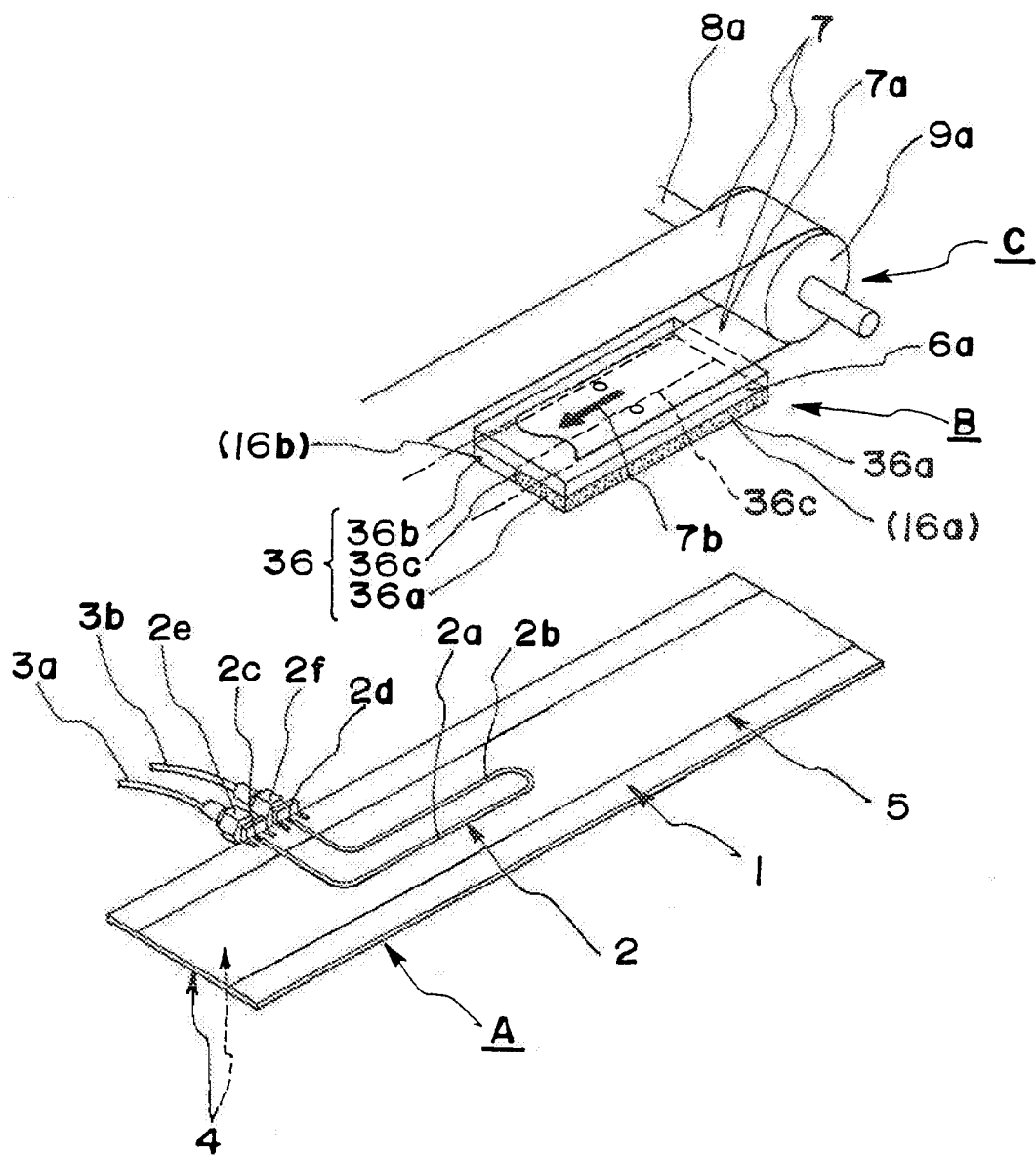
FIG. 4 is a perspective explanatory view of a main portion extracted from a configuration example of an embodiment of a variable ISI transmission channel apparatus of an aspect of the inventions of claims 11, 12, 13 and 14.

FIG. 4 depicts a configuration of another embodiment related to the transmission loss generating member and the constituent elements denoted by the same reference numerals in FIG. 1 denote the same respective elements.

The transmission loss generating means (B) is made up of a sliding combined body (36) formed by combining a dielectric half piece (36a) and an electric conductor half piece (36b) instead of the dielectric (6) acting as the transmission loss generating member.

The configuration and operations of the portions other than the transmission loss generating means (B) are the same as the embodiment of FIG. 1.

The dielectric half piece (36a) is of the same material as the dielectric (6) in the embodiment depicted in FIG. 1 and the electric conductor half piece (36b) is of the same material as the electric conductor (26) in the embodiment depicted in FIG. 3.

The sliding combined body (36) of the dielectric half piece (36a) and the electric conductor half piece (36b) is fixed via an attachment support plate (6a) to the lower half (7a) of the drive belt (7).

The dielectric half piece (36a) and the electric conductor half piece (36b) of the sliding combined body (36) are each formed into a rectangular parallelepiped having a rectangular shape in a plane view and are integrated by joining long sides of the rectangles together along the longitudinal direction of the lower half (7a) of the drive belt (7).

A boundary line (36c) between the undersurfaces of the dielectric half piece (36a) and the electric conductor half piece (36b) combined as the sliding combined body (36) is located in an intermediate area between a pair of the parallel line portions (2a) (2b) of the U-shaped conductor strip (2) on the plate-shaped dielectric substrate (1) and is extended in parallel with the parallel line portions (2a) (2b).

Therefore, when the sliding combined body (36) faces the top surface of the conductor strip (2) and slides in contact with the sliding support sheet (5) on the plate-shaped dielectric substrate (1), the dielectric half piece (36a) and the electric conductor half piece (36b) correspondingly face the one parallel line portion (2a) and the other parallel line portion (2b), respectively.

When the dielectric half piece (36a) faces the parallel line portion (2a) of the conductor strip (2), a dielectric loss is generated in the dielectric half piece (36a) due to the electric field from the high-frequency signal on the parallel line portion (2a) and is reflected as a transmission loss of the high-frequency signal on the parallel line portion (2a).

When the electric conductor half piece (36b) faces the parallel line portion (2b) of the conductor strip (2), a resistance loss is generated in the electric conductor half piece (36b) due to the magnetic field from the high-frequency signal on the parallel line portion (2b) and is reflected as a transmission loss of the high-frequency signal on the parallel line portion (2b).

For a modified embodiment of the embodiment of FIG. 4, a sliding combined body (36) formed by combining a magnetic body half piece (16a) and the electric conductor half piece (36b) can also be employed by replacing the magnetic body (16) of FIG. 2 with the magnetic body half piece (16a) made in the same dimensions as the dielectric half piece (36a) of FIG. 4 with respect to the dielectric half piece (36a) out of the sliding combined body (36) made up of the dielectric half piece (36a) and the electric conductor half piece (36b) of FIG. 4.

In the configuration of this embodiment, the transmission loss generating means (B) is made up of the sliding combined body (36) formed by combining the magnetic body half piece (16a) and the electric conductor half piece (36b).

In this case, when the replaced magnetic body half piece (16a) of FIG. 4 faces the parallel line portion (2a) of the conductor strip (2) instead of the dielectric half piece (36a) of FIG. 4, a magnetic loss is generated in the magnetic body half piece (16a) due to the magnetic field from the high-frequency signal on the parallel line portion (2a) and is reflected as a transmission loss of the high-frequency signal on the parallel line portion (2a).

For another modified embodiment of the embodiment of FIG. 4, a sliding combined body (16b) (36a) formed by combining a magnetic body half piece (16b) and the dielectric half piece (36a) can also be employed by replacing the magnetic body (16) of FIG. 2 with the magnetic body half piece (16b) made in the same dimensions as the electric conductor half piece (36b) of FIG. 4 with respect to the electric conductor half piece (36b) out of the sliding combined body (36) made up of the dielectric half piece (36a) and the electric conductor half piece (36b) of FIG. 4.

In the configuration of this embodiment, the transmission loss generating means (B) is made up of the sliding combined body (16b) (36a) formed by combining the magnetic body half piece (16b) and the dielectric half piece (36a).

In this case, when the replaced magnetic body half piece (16b) of FIG. 4 faces the parallel line portion (2b) of the conductor strip (2) instead of the electric conductor half piece (36b) of FIG. 4, a magnetic loss is generated in the magnetic body half piece (16b) due to the magnetic field from the high-frequency signal on the parallel line portion (2b) and is reflected as a transmission loss of the high-frequency signal on the parallel line portion (2b).

Figure 5:
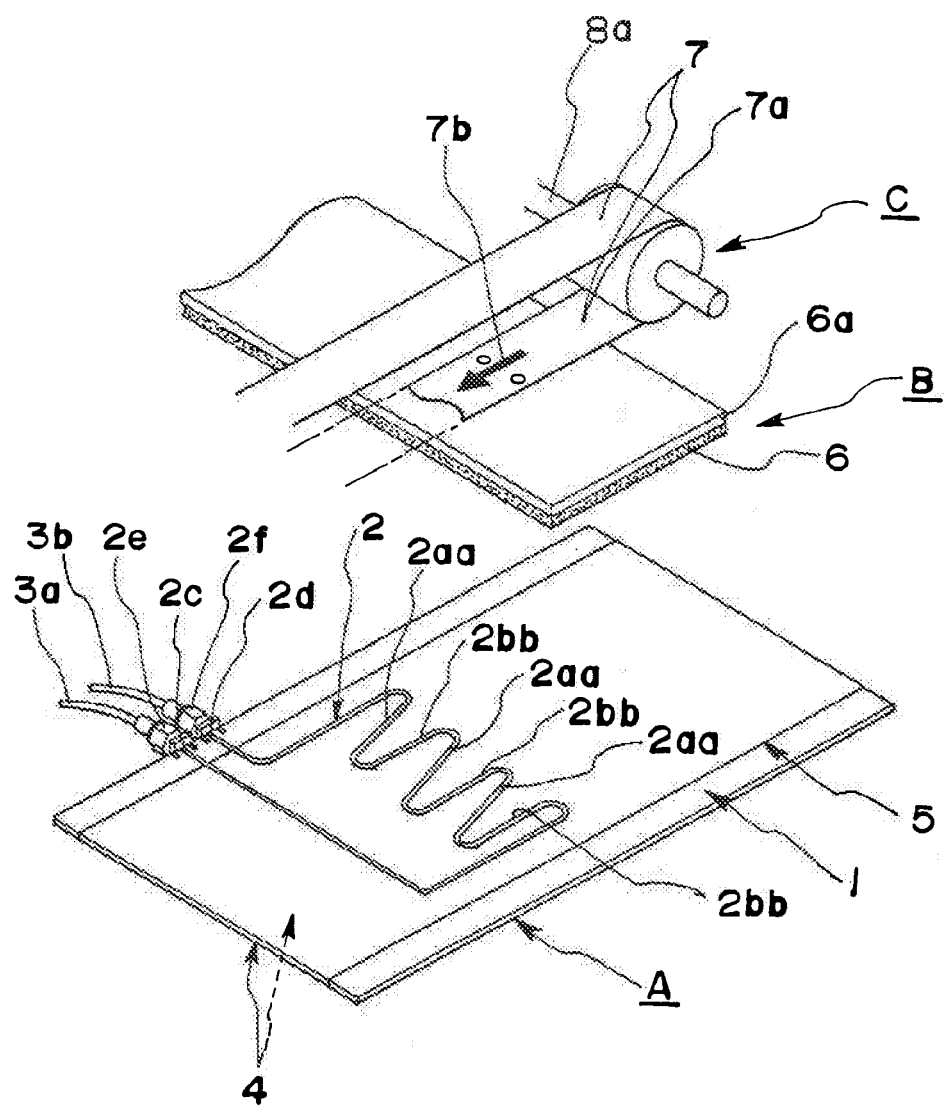
FIG. 5 is a perspective explanatory view of a main portion extracted from a configuration example of an embodiment of a variable ISI transmission channel apparatus of an aspect of the invention of claim 4.

FIG. 5 depicts a configuration of another embodiment related to the conductor strip (2) of the conductor-strip-exposed transmission channel means (A) and the constituent elements denoted by the same reference numerals in FIG. 1 denote the same respective elements.

The conductor strip (2) on the top surface of the plate-shaped dielectric substrate (1) extends over a longitudinal area of repeated feature of a pattern drawing waves in a plane view having a plurality of first oblique portions (2aa) each extending from a crest point to a trough point and a plurality of second oblique portions (2bb) each extending from a trough point to a crest point in an oblique direction on the top surface of the substrate (1) relative to, e.g., in a direction intersecting with, the sliding direction indicated by the arrow (7b) of FIG. 5 of the dielectric (6) acting as the transmission loss generating member of the transmission loss generating means (B). The longitudinal direction of the longitudinal area in itself also turns out to be on a plane surface intersecting with or perpendicular to the sliding direction of the transmission loss generating means (B).

When the dielectric (6) slides in the direction of the arrow (7b) of FIG. 5 and the facing area of the undersurface of the dielectric (6) with the wave pattern conductor strip (2), increases, the facing area with a plurality of sets of the first oblique portions (2aa) and the second oblique portions (2bb) also increases concurrently at the same time (2bb) and, therefore, an increment of the facing area and, thus, a degree of change (an increment) in an ISI amount on an ISI transmission channel, relative to a sliding distance of the dielectric (6) can be ensured at a higher level within the limited area of the top surface of the substrate (1).

When the dielectric (6) slides in the direction opposite to the direction of the arrow (7b) of FIG. 5, a decrement (a degree of change) in the facing area relative to a sliding distance of the dielectric (6) can be ensured at a higher level according to an inverted mechanism.

Figure 6:
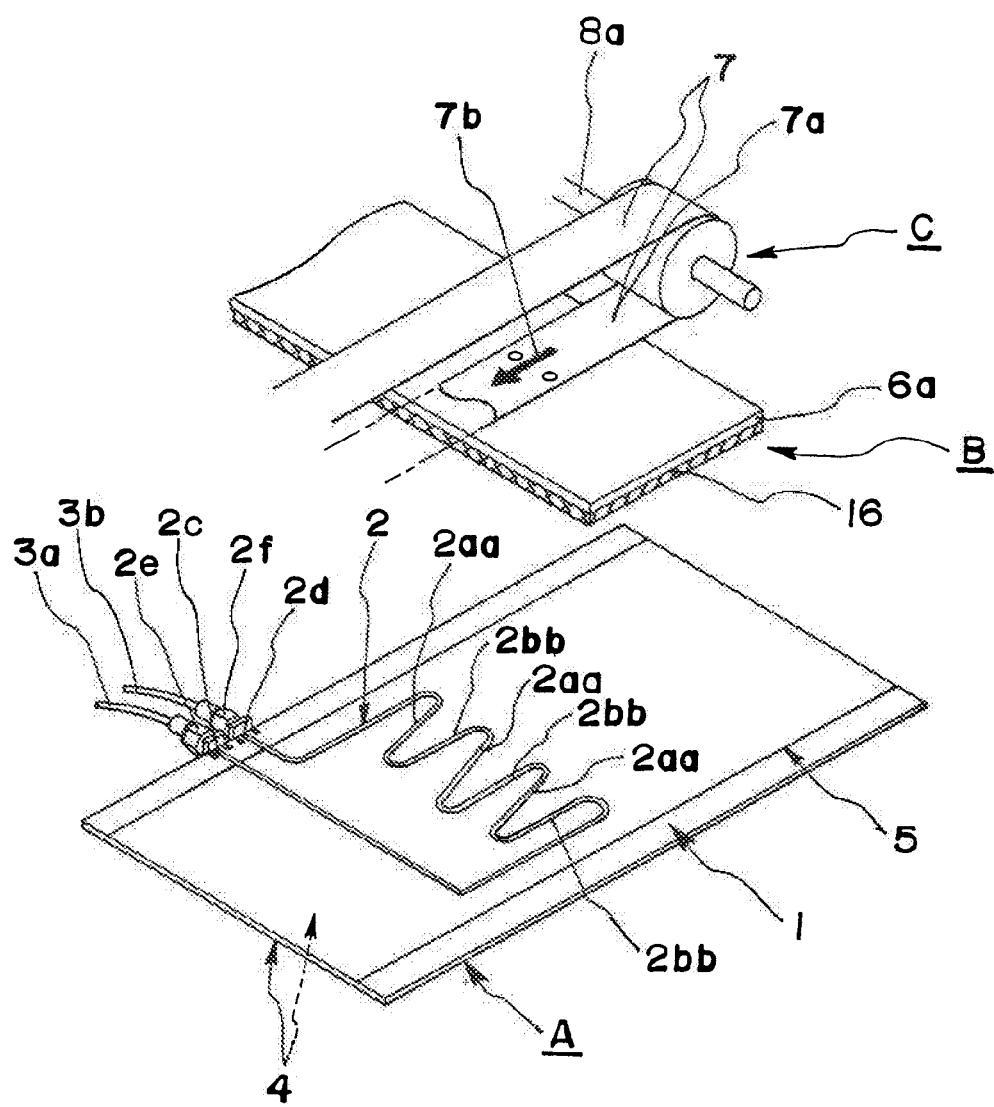
FIG. 6 is a perspective explanatory view of the main portion extracted from the configuration example of the embodiment of a variable ISI transmission channel apparatus of an aspect of the invention of claim 7.

FIG. 6 depicts a configuration of a modified embodiment of the embodiment depicted in FIG. 5 and the constituent elements denoted by the same reference numerals in FIGS. 2 and 5 denote the same respective elements.

In the configuration of FIG. 6, the magnetic body (16) employed in the embodiment of FIG. 2 is employed instead of the dielectric (6) acting as the transmission loss generating member of the transmission loss generating means (B).

Figure 7:
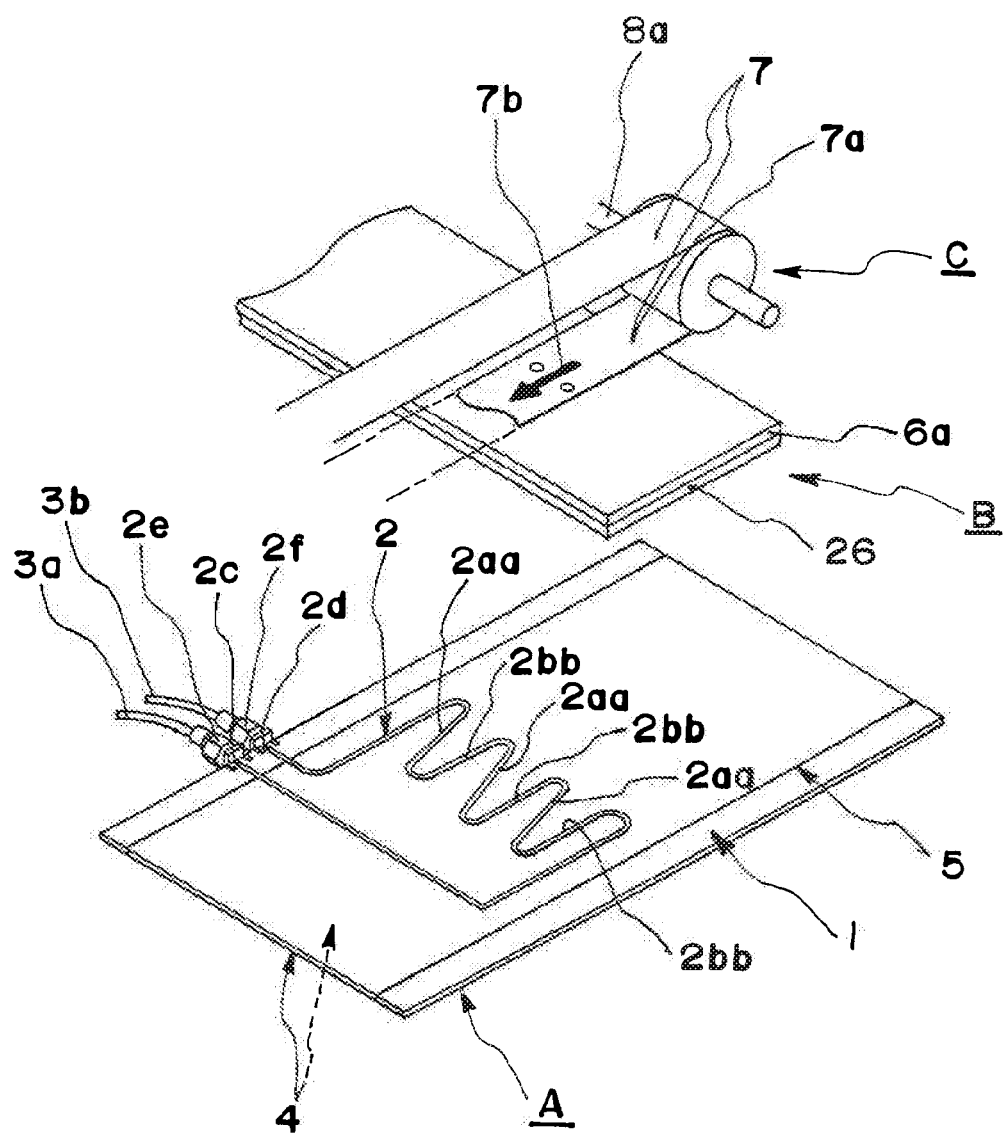
FIG. 7 is a perspective explanatory view of the main portion extracted from the configuration example of the embodiment of a variable ISI transmission channel apparatus of an aspect of the invention of claim 10.

FIG. 7 depicts a configuration of a modified embodiment of the embodiment depicted in FIG. 5 and the constituent elements denoted by the same reference numerals in FIGS. 3 and 5 denote the same respective elements.

In the configuration of FIG. 7, the electric conductor (26) employed in the embodiment of FIG. 3 is employed instead of the dielectric (6) acting as the transmission loss generating member of the transmission loss generating means (B).

Figure 8:
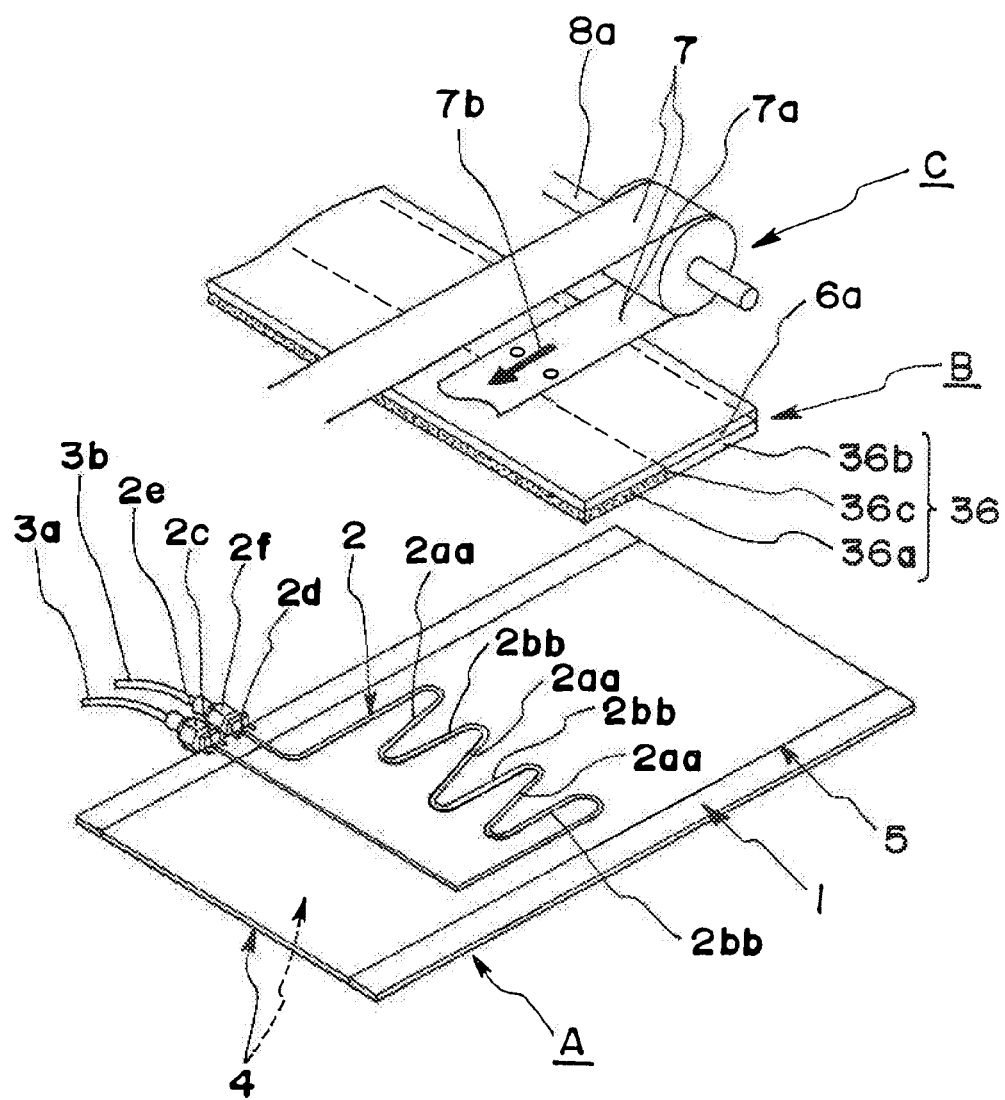
FIG. 8 is a perspective explanatory view of a main portion extracted from a configuration example of another embodiment of a variable ISI transmission channel apparatus of an aspect of the inventions of claims 15 and 16.
Figure 9:
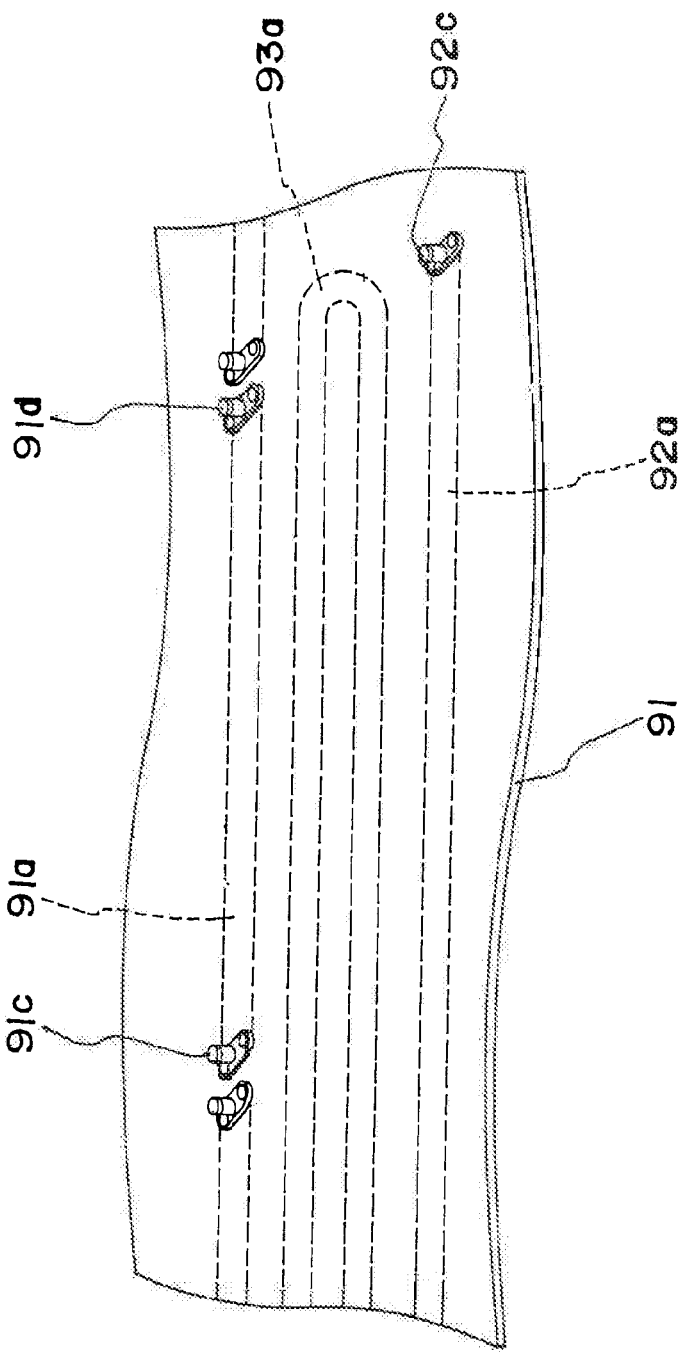
FIG. 9 is a perspective explanatory view of an ISI board of a conventional technique.

FIG. 8 depicts a configuration of a modified embodiment of the embodiment depicted in FIG. 5 and the constituent elements denoted by the same reference numerals in FIGS. 4 and 5 denote the same respective elements.

In the configuration of FIG. 8, the sliding combined body (36) made up of the dielectric half piece (36a) and the electric conductor half piece (36b) employed in the embodiment of FIG. 4 is employed instead of the dielectric (6) acting as the transmission loss generating member of the transmission loss generating means (B).

It is noted that in the configuration of FIG. 8, the boundary line (36c) between the undersurfaces of the dielectric half piece (36a) and the electric conductor half piece (36b) combined as the sliding combined body (36) is located along a straight line intersecting with a plurality of the first oblique portions (2aa) each extending from a crest point to a trough point and a plurality of the second oblique portions (2bb) each extending from a trough point to a crest point of the conductor strip (2) drawing a pattern of waves in a plane view as depicted in FIG. 5 on the plate-shaped dielectric substrate (1).

Therefore, the boundary line (36c) extends in a direction orthogonal to the sliding direction of the sliding combined body (36) indicated by the arrow (7b) of FIG. 8.

The dielectric half piece (36a) is disposed on the side forming the facing area on ahead when the sliding combined body (36) starts sliding to form the facing area with the conductor strip (2).

Thus, unlike the case of the embodiment of FIG. 4, as the facing area increases in accordance with a setting operation, the dielectric loss in the dielectric half piece (36a) is first reflected as a transmission loss of the high-frequency signal on the conductor strip (2) and, subsequently, when the facing area further increases, the resistance loss in the electric conductor half piece (36b) is reflected redundantly as a transmission loss of the high-frequency signal in addition to the transmission loss derived from the dielectric loss.

For a modified embodiment of the embodiment of FIG. 8, the sliding combined body (16a) (36b) formed by combining the magnetic body half piece (16a) and the electric conductor half piece (36b) can also be employed by replacing the magnetic body (16) of FIG. 6 with the magnetic body half piece (16a) made in the same dimensions as the dielectric half piece (36a) of FIG. 8 with respect to the dielectric half piece (36a) out of the sliding combined body (36) made up of the dielectric half piece (36a) and the electric conductor half piece (36b) of FIG. 8.

In this case, when the replaced magnetic body half piece (16a) of FIG. 8 faces the first oblique portions (2aa) or the second oblique portions (2bb) of the conductive strip (2) instead of the dielectric half piece (36a) of FIG. 8, a magnetic loss is generated in the magnetic body half piece (16a) due to the magnetic field from the high-frequency signal on the oblique portions (2aa) (2bb) and is reflected as a transmission loss of the high-frequency signal on the oblique portions (2aa) (2bb).

For another modified embodiment of the embodiment of FIG. 8, the sliding combined body (16b) (36a) formed by combining the magnetic body half piece (16b) and the dielectric half piece (36a) can also be employed by replacing the magnetic body (16) of FIG. 6 with the magnetic body half piece (16b) made in the same dimensions as the electric conductor half piece (36b) of FIG. 8 with respect to the electric conductor half piece (36b) out of the sliding combined body (36) made up of the dielectric half piece (36a) and the electric conductor half piece (36b) of FIG. 8.

In this case, when the replacement magnetic body (16b) of FIG. 8 faces the first oblique portions (2aa) or the second oblique portions (2bb) of the conductive strip (2) instead of the electric conductor half piece (36b) of FIG. 8, a magnetic loss is generated in the magnetic body half piece (16a) due to the magnetic field from the high-frequency signal on the oblique portions (2aa) (2bb) and is reflected as a transmission loss of the high-frequency signal on the oblique portions (2aa) (2bb).

INDUSTRIAL APPLICABILITY

As described above, the aspects of inventions of claims 1 to 12 provide a variable ISI transmission channel apparatus capable of simulating an ISI environment in an actually operated high-speed transmission channel in a situation such as a bit error test for the high-speed serial data communication and therefore have enormous industrial applicability.

The invention claimed is:
1. A variable intersymbol interference ("ISI") transmission channel apparatus comprising:
   a conductor-strip-exposed transmission channel means (A) including a conductor strip (2) exposed and extended on a top surface of a dielectric substrate (1);
   a transmission loss generating means (B) made up of a transmission loss generating member (6) (16) (26) (36) having an undersurface facing a top surface of the conductor strip (2) of the conductor-strip-exposed transmission channel means (A) to generate, depending on a facing area of the undersurface, an amount of loss to set an ISI amount for the high speed serial data transmission by a high-frequency signal on the conductor strip (2); and a transmission loss generating member driving means (C) that variably sets the ISI amount based at least in part on a position of the transmission loss generating member (6) (16) (26) (36) driven above the conductor strip (2) along a linear path crossing over the conductor-strip-exposed transmission channel means (A) increasing and decreasing a facing area of the undersurface of the transmission loss generating member.

2. The variable ISI transmission channel apparatus of claim 1, wherein the transmission loss generating member of the transmission loss generating means (B) is a dielectric (6).

3. The variable ISI transmission channel apparatus of claim 2, wherein the conductor strip (2) of the conductor-strip-exposed transmission channel means (A) extends over a longitudinal area of continued feature of a pattern drawing a U-shape pattern in a plane view, having a pair of parallel line portions (2a) (2b), a longitudinal direction of the longitudinal area being set on a plane surface along or intersected with a sliding direction of the transmission loss generating means (B).

4. The variable ISI transmission channel apparatus of claim 2, wherein the conductor strip (2) of the conductor-strip-exposed transmission channel means (A) extends over a longitudinal area of repeated feature of a pattern drawing waves in a plane view, having a plurality of first oblique portions (2aa) each extending from a crest point to a trough point and a plurality of second oblique portions (2bb) each extending from a trough point to a crest point in a direction oblique, a longitudinal direction of the longitudinal area being set on a plane surface along or intersected with a sliding direction of the transmission loss generating means (B) on the top surface of the dielectric substrate (1).

5. The variable ISI transmission channel apparatus of claim 1, wherein the transmission loss generating member of the transmission loss generating means (B) is a magnetic body (16).

6. The variable ISI transmission channel apparatus of claim 5, wherein the conductor strip (2) of the conductor-strip-exposed transmission channel means (A) extends over a longitudinal area of continued feature of a pattern drawing a U-shape pattern in a plane view, having a pair of parallel line portions (2a) (2b), a longitudinal direction of the longitudinal area being set on a plane surface along or intersected with a sliding direction of the transmission loss generating means (B) on the top surface of the dielectric substrate (1).

7. The variable ISI transmission channel apparatus of claim 5, wherein the conductor strip (2) of the conductor-strip-exposed transmission channel means (A) extends over a longitudinal area of repeated feature of a pattern drawing waves in a plane view, having a plurality of first oblique portions (2aa) each extending from a crest point to a trough point and a plurality of second oblique portions (2bb) each extending from a trough point to a crest point in a direction oblique, a longitudinal direction of the longitudinal area being set on a plane surface along or intersected with a sliding direction of the transmission loss generating means (B) on the top surface of the dielectric substrate (1).

8. The variable ISI transmission channel apparatus of claim 1, wherein the transmission loss generating member of the transmission loss generating means (B) is an electric conductor (26).

9. The variable ISI transmission channel apparatus of claim 8, wherein the conductor strip (2) of the conductor-strip-exposed transmission channel means (A) extends over a longitudinal area of continued feature of a pattern drawing a U-shape pattern in a plane view, having a pair of parallel line portions (2a) (2b), a longitudinal direction of the longitudinal area being set on a plane surface along or intersected with a sliding direction of the transmission loss generating means (B) on the top surface of the dielectric substrate (1).

10. The variable ISI transmission channel apparatus of claim 8, wherein the conductor strip (2) of the conductor-strip-exposed transmission channel means (A) extends over a longitudinal area of repeated feature of a pattern drawing waves in a plane view, having a plurality of first oblique portions (2aa) each extending from a crest point to a trough point and a plurality of second oblique portions (2bb) each extending from a trough point to a crest point in a direction oblique, a longitudinal direction of the longitudinal area being set on a plane surface along or intersected with a sliding direction of the transmission loss generating means (B) on the top surface of the dielectric substrate (1).

11. The variable ISI transmission channel apparatus of claim 1, wherein the transmission loss generating member of the transmission loss generating means (B) is a sliding combined body (36) formed by combining a dielectric half piece (36a) and an electric conductor half piece (36b) making a pair, wherein an undersurface of the dielectric half piece (36a) of the sliding combined body (36) faces a portion of the conductor strip (2), wherein an undersurface of the electric conductor half piece (36b) of the sliding combined body (36) faces another portion of the conductor strip (2), and wherein the transmission loss generating member driving means (C) drives and slides the sliding combined body (36) in a sliding direction to an increase and decrease in a facing area of the undersurface of the sliding combined body (36) facing the conductor strip (2).

12. The variable ISI transmission channel apparatus of claim 11, wherein the conductor strip (2) of the conductor-strip-exposed transmission channel means (A) extends over a longitudinal area of continued feature of a pattern drawing a U-shape pattern in a plane view, having a pair of parallel line portions (2a) (2b), a longitudinal direction of the longitudinal area being set on a plane surface along or intersected with a sliding direction of the transmission loss generating means (B), and wherein a boundary line (36c) between undersurfaces of the pair of the dielectric half piece (36a) and the electric conductor half piece (36b) of the sliding combined body (36) is located between the pair of the parallel line portions (2a) (2b) of the U-shape.

13. The variable ISI transmission channel apparatus of claim 11, wherein the conductor strip (2) of the conductor-strip-exposed transmission channel means (A) extends over a longitudinal area of repeated feature of a pattern drawing waves in a plane view, having a plurality of first oblique portions (2aa) each extending from a crest point to a trough point and a plurality of second oblique portions (2bb) each extending from a trough point to a crest point in a direction oblique, a longitudinal direction of the longitudinal area being set on a plane surface along or intersected with a sliding direction of the transmission loss generating means (B) on the top surface of the dielectric substrate (1), and wherein a boundary line (36c) between undersurfaces of the pair of the dielectric half piece (36a) and the electric conductor half piece (36b) of the sliding combined body (36) is located along a straight line intersecting with the plurality of first oblique portions (2aa) and the plurality of second oblique portions (2bb).

14. The variable ISI transmission channel apparatus of claim 1, wherein the transmission loss generating member of the transmission loss generating means (B) is a sliding combined body (16a) (36b) formed by combining a magnetic body half piece (16a) and an electric conductor half piece (36b) making a pair, wherein an undersurface of the magnetic body half piece (16a) of the sliding combined body (16a) (36b) faces a portion of the conductor strip (2), wherein an undersurface of the electric conductor half piece (36b) of the sliding combined body (16a) (36b) faces another portion of the conductor strip (2), and wherein the transmission loss generating member driving means (C) drives and slides the sliding combined body in a sliding direction to an increase and decrease in a facing area of the undersurface of the sliding combined body (16a) (36b) facing the conductor strip (2).

15. The variable ISI transmission channel apparatus of claim 14, wherein the conductor strip (2) of the conductor-strip-exposed transmission channel means (A) extends over a longitudinal area of continued feature of a pattern drawing a U-shape pattern in a plane view, having a pair of parallel line portions (2a) (2b), a longitudinal direction of the longitudinal area being set on a plane surface along or intersected with a sliding direction of the transmission loss generating means (B), and wherein a boundary line (36c) between undersurfaces of the pair of the magnetic body half piece (16a) and the electric conductor half piece (36b) of the sliding combined body (16a) (36b) is located between the pair of the parallel line portions (2a) (2b) of the U-shape.

16. The variable ISI transmission channel apparatus of claim 14, wherein the conductor strip (2) of the conductor-strip-exposed transmission channel means (A) extends over a longitudinal area of repeated feature of a pattern drawing waves in a plane view, having a plurality of first oblique portions (2aa) each extending from a crest point to a trough point and a plurality of second oblique portions (2bb) each extending from a trough point to a crest point in a direction oblique, a longitudinal direction of the longitudinal area being set on a plane surface along or intersected with a sliding direction of the transmission loss generating means (B) on the top surface of the dielectric substrate (1), and wherein a boundary line (36c) between undersurfaces of a pair of the magnetic body half piece (16a) and the electric conductor half piece (36b) of the sliding combined body is located along a straight line intersecting with the plurality of first oblique portions (2aa) and the plurality of second oblique portions (2bb).

17. A variable intersymbol interference ("ISI") transmission channel apparatus comprising:

a conductor-strip-exposed transmission channel means (A) including a conductor strip (2) exposed and extended on a top surface of a dielectric substrate (1);

a transmission loss generating means (B) made up of a transmission loss generating member (6) (16) (26) (36) having an undersurface facing the top surface of the conductor strip (2) of the conductor-strip-exposed transmission channel means (A) to generate, depending on a facing area of the undersurface, an amount of loss to set an ISI amount for the high speed serial data transmission by a high-frequency signal on the conductor strip (2);

a transmission loss generating member driving means (C) that variably sets the ISI amount based at least in part on a position of the transmission loss generating member (6) (16) (26) (36) driven above the conductor strip (2) along a linear path crossing over the conductor-strip-exposed transmission channel means (A) increasing and decreasing a facing area of the undersurface of the transmission loss generating member; and a sliding support sheet (5) made of a thin insulating material having a low-friction-coefficient and low dielectric constant interposed between the conductor strip (2) of the transmission channel means (A) and the transmission loss generating member (6) (16) (26) (36) of the transmission loss generating means (B) in a range covering the conductor strip (2).

18. A method of variably setting an amount of intersymbol interference (ISI), in a high-frequency signal for transmission of high speed serial data is fed to a conductor strip (2) exposed and extended on a top surface of a dielectric substrate (1), the method comprising:

a) stationing an undersurface of a transmission loss generating member (6) (16) (26) (36) so as to face a top surface of the conductor strip (2) to generate losses on the transmission loss generating member (6) (16) (26) (36) to give rise to an ISI amount for the high frequency signal for transmission, depending on a facing area of the undersurface; and b) variably setting the ISI amount based at least in part on a position of the transmission loss generating member (6) (16) (26) (36) by driving the transmission loss generating member (6) (16) (26) (36) above the conductor strip (2) along a linear path crossing over a conductor-strip-exposed transmission channel means increasing and decreasing the facing area of the undersurface of the transmission loss generating member (6) (16) (26) (36).

* * * * *